US010756960B2

(12) United States Patent
Lu et al.

(10) Patent No.: US 10,756,960 B2
(45) Date of Patent: Aug. 25, 2020

(54) LIGHT-EMITTING DEVICE

(71) Applicant: EPISTAR CORPORATION, Hsinchu (TW)

(72) Inventors: Chih-Chiang Lu, Hsinchu (TW); Yi-Chieh Lin, Hsinchu (TW); Wen-Luh Liao, Hsinchu (TW); Shou-Lung Chen, Hsinchu (TW); Chien-Fu Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/258,250

(22) Filed: Jan. 25, 2019

(65) Prior Publication Data

US 2019/0158352 A1 May 23, 2019

Related U.S. Application Data

(63) Continuation of application No. 15/335,078, filed on Oct. 26, 2016, now Pat. No. 10,236,411, which is a
(Continued)

(51) Int. Cl.
*H01L 33/00* (2010.01)
*H01L 33/62* (2010.01)
(Continued)

(52) U.S. Cl.
CPC .......... *H04L 41/0695* (2013.01); *H01L 27/15* (2013.01); *H01L 33/005* (2013.01);
(Continued)

(58) Field of Classification Search
CPC ........... H01L 21/0251; H01L 21/02458; H01L 21/02505; H01L 33/007; H01L 33/30;
(Continued)

(56) References Cited

U.S. PATENT DOCUMENTS 5,157,681 A 10/1992 Aoyagi et al.
5,381,756 A 1/1995 Kondo et al.
(Continued)

FOREIGN PATENT DOCUMENTS

CN 1298553 A 6/2001

*Primary Examiner* — Caridad Everhart
(74) *Attorney, Agent, or Firm* — Ditthavong & Steiner P.C.

(57) ABSTRACT

A light-emitting device comprises a first light-emitting semiconductor stack comprising a first active layer; a second light-emitting semiconductor stack below the first light-emitting semiconductor stack, wherein the second light-emitting semiconductor stack comprises a second active layer; a reflector between the first light-emitting semiconductor stack and the second light-emitting semiconductor stack; a protecting layer between the reflector and the second light-emitting semiconductor stack; and wherein the first light-emitting semiconductor stack further comprises a first semiconductor layer and a second semiconductor layer sandwiching the first active layer, the second light-emitting semiconductor stack further comprises a third semiconductor layer and a fourth semiconductor layer sandwiching the second active layer, wherein the second semiconductor layer has a first band gap, the third semiconductor layer has a second band gap, and the protecting layer has a third band gap between the first band gap and the second band gap.

19 Claims, 14 Drawing Sheets

Related U.S. Application Data continuation of application No. 14/550,016, filed on Nov. 21, 2014, now Pat. No. 9,508,891.

(51) Int. Cl.

| | |
|---|---|
| ***H01L 27/15*** | (2006.01) |
| ***H04L 12/24*** | (2006.01) |
| ***H01L 33/10*** | (2010.01) |
| ***H01L 33/08*** | (2010.01) |
| ***H01L 33/50*** | (2010.01) |
| ***H01L 33/56*** | (2010.01) |
| ***H04L 12/803*** | (2013.01) |

(52) U.S. Cl.

CPC .......... *H01L 33/0062* (2013.01); *H01L 33/08* (2013.01); *H01L 33/10* (2013.01); *H01L 33/50* (2013.01); *H01L 33/56* (2013.01); *H01L 33/62* (2013.01); *H04L 41/0668* (2013.01); *H04L 41/0816* (2013.01); *H04L 47/125* (2013.01); *H01L 2224/48091* (2013.01); *H01L 2224/49107* (2013.01); *H01L 2224/73265* (2013.01); *H01L 2933/0016* (2013.01); *H01L 2933/0025* (2013.01); *H01L 2933/0058* (2013.01); *H01L 2933/0066* (2013.01)

(58) Field of Classification Search

CPC ... H01L 2933/0058; H01L 2924/00014; H01L 33/62; H01L 33/0025; H01L 2224/48091

See application file for complete search history.

(56) References Cited

U.S. PATENT DOCUMENTS

| | | | |
|---|---|---|---|
| 5,739,552 A | | 4/1998 | Kimura et al. |
| 5,751,468 A | | 5/1998 | Hyun et al. |
| 5,999,553 A | | 12/1999 | Sun |
| 6,347,233 B1 | * | 2/2002 | Thomas .............. H04L 27/0008 327/164 |
| 6,897,489 B1 | * | 5/2005 | Peng ....................... H01L 33/08 257/103 |
| 8,686,451 B2 | | 4/2014 | Gmeinwieser et al. |
| 2002/0003234 A1 | | 1/2002 | Hayashi et al. |
| 2002/0053676 A1 | * | 5/2002 | Kozaki .................. B82Y 20/00 257/88 |
| 2003/0178626 A1 | | 9/2003 | Sugiyama et al. |
| 2004/0090779 A1 | * | 5/2004 | Ou .......................... H01L 33/08 362/231 |
| 2004/0096996 A1 | | 5/2004 | Cheng et al. |
| 2005/0058710 A1 | | 3/2005 | Straub et al. |
| 2005/0127391 A1 | | 6/2005 | Yanamoto |
| 2005/0189551 A1 | * | 9/2005 | Peng ................... H01L 25/0756 257/94 |
| 2006/0006375 A1 | * | 1/2006 | Ou .......................... H01L 33/08 257/14 |
| 2006/0062267 A1 | | 3/2006 | Tanaka |
| 2006/0220043 A1 | * | 10/2006 | Kim ........................ H01L 33/38 257/96 |
| 2006/0284195 A1 | | 12/2006 | Nagai |
| 2009/0302307 A1 | | 12/2009 | Gronninger et al. |
| 2011/0175113 A1 | * | 7/2011 | Bae ......................... H01L 33/38 257/79 |
| 2013/0175500 A1 | | 7/2013 | Cho et al. |
| 2014/0377459 A1 | | 12/2014 | Kawashima |
| 2016/0204306 A1 | * | 7/2016 | Ma .......................... H01L 33/06 257/13 |

* cited by examiner

LIGHT-EMITTING DEVICE

CROSS REFERENCE TO RELATED APPLICATIONS

This application is a continuation of U.S. patent application Ser. No. 15/335,078, entitled "LIGHT-EMITTING DEVICE," filed on Oct. 26, 2016, which is a continuation of U.S. patent application Ser. No. 14/550,016 (Now U.S. Pat. No. 9,508,891), entitled "METHOD FOR MAKING LIGHT-EMITTING DEVICE," filed on Nov. 21, 2014. The disclosures of all references cited herein are incorporated by reference.

TECHNICAL FIELD

The disclosure relates to a light-emitting device, and more particularly to a light-emitting device comprising a protecting layer.

DESCRIPTION OF BACKGROUND ART

Light-emitting diodes (LEDs) are widely used as light sources in semiconductor devices. Compared to conventional incandescent light lamps or fluorescent light tubes, light-emitting diodes have advantages such as lower power consumption and longer lifetime, and therefore they gradually replace the conventional light sources and are applied to various fields such as traffic lights, back light modules, street lighting, and medical equipment.

FIG. 14 schematically shows a conventional light-emitting device comprising an LED 51, a submount 52 having an electrical circuit 54, and a solder 56 electrically connecting the electrical circuit 54 of the submount 52 to the LED 51, wherein the LED 51 comprises a substrate 53, and a wire 58 for electrically connecting an electrode 55 of the LED 51 to the electrical circuit 54 of the submount 52.

SUMMARY OF THE DISCLOSURE

The present disclosure provides a light-emitting device, comprising a first light-emitting semiconductor stack comprising a first active layer; a second light-emitting semiconductor stack below the first light-emitting semiconductor stack, wherein the second light-emitting semiconductor stack comprises a second active layer; a reflector between the first light-emitting semiconductor stack and the second light-emitting semiconductor stack; a protecting layer between the reflector and the second light-emitting semiconductor stack; wherein the first active layer emits a first radiation of a first wavelength, and the second active layer emits a second radiation of a second wavelength longer than the first wavelength; and wherein the first light-emitting semiconductor stack further comprises a first semiconductor layer and a second semiconductor layer sandwiching the first active layer, the second light-emitting semiconductor stack further comprises a third semiconductor layer and a fourth semiconductor layer sandwiching the second active layer, wherein the second semiconductor layer has a first band gap, the third semiconductor layer has a second band gap, and the protecting layer has a third band gap between the first band gap and the second band gap.

The present disclosure provides a light-emitting device, comprising a first light-emitting semiconductor stack comprising a first active layer; a second light-emitting semiconductor stack below the first light-emitting semiconductor stack, wherein the second light-emitting semiconductor stack comprises a second active layer; a reflector between the first light-emitting semiconductor stack and the second light-emitting semiconductor stack; an etching stop layer between the reflector and the second light-emitting semiconductor stack, wherein the etching stop layer has a first transverse width; a first contact layer between the etching stop layer and the second light-emitting semiconductor stack, wherein the first contact layer has a second transverse width; wherein the first active layer emits a first radiation of a first wavelength and the second active layer emits a second radiation of a second wavelength longer than the first wavelength; and wherein the second transverse width is greater than the first transverse width.

DETAILED DESCRIPTION OF PREFERRED EMBODIMENTS

Figure 1:
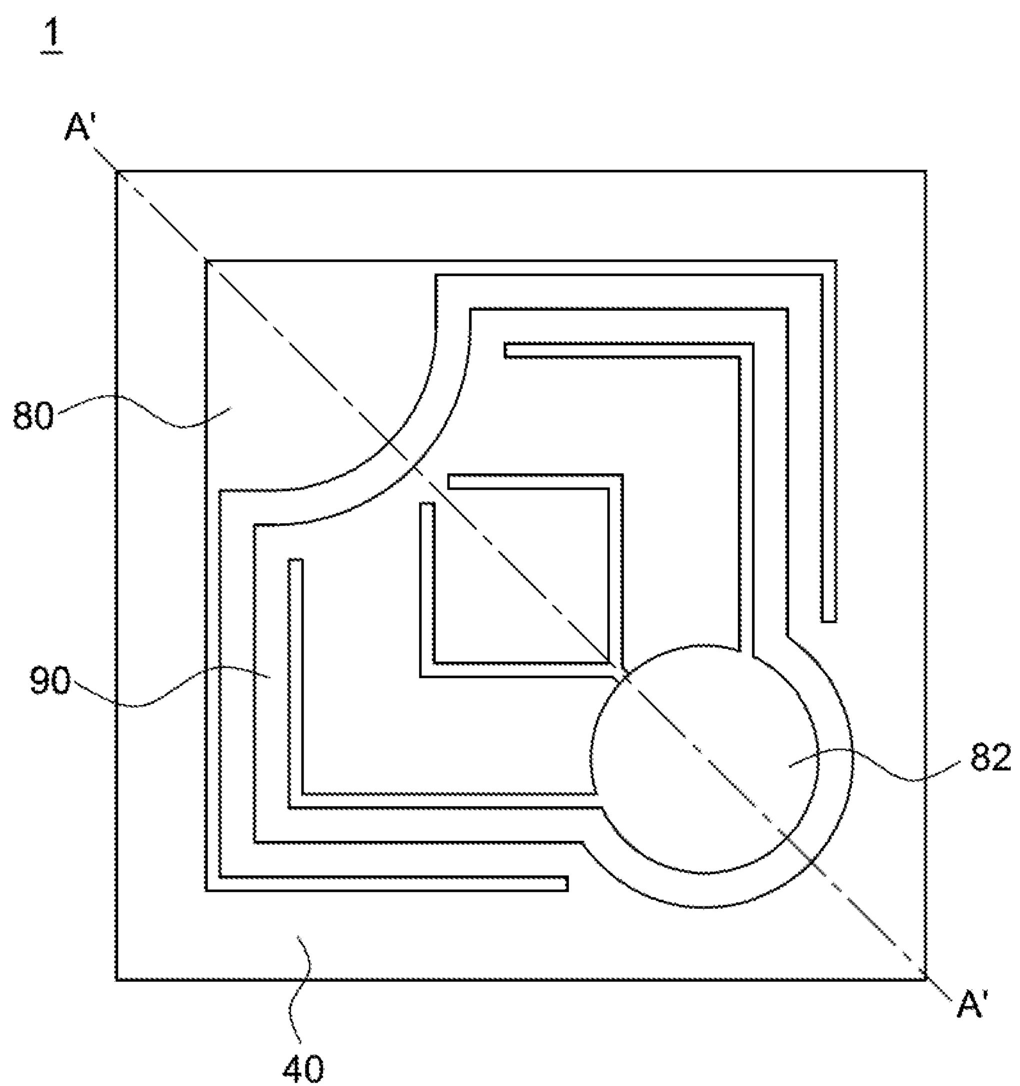
FIG. 1 is a top view of the light-emitting device in accordance with one of the embodiments of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present application, if not specifically mention, the general expression of AlGaAs means $Al_xGa_{(1-x)}As$, wherein $0<x<1$; the general expression of AlInP means $Al_xIn_{(1-x)}P$, wherein $0<x<1$; the general expression of AlGaInP means $(Al_yGa_{(1-y)})In_xP_{1-x}$, wherein $0\leq x\leq 1$, $0\leq y\leq 1$, and $x+y=1$; and the general expression of InGaP means $In_xGa_{1-x}P$, wherein 0<x<1. The content of the element can be adjusted for different purposes, such as matching the lattice constant of the growth substrate or reflecting a predetermined wavelength range.

Figure 2:
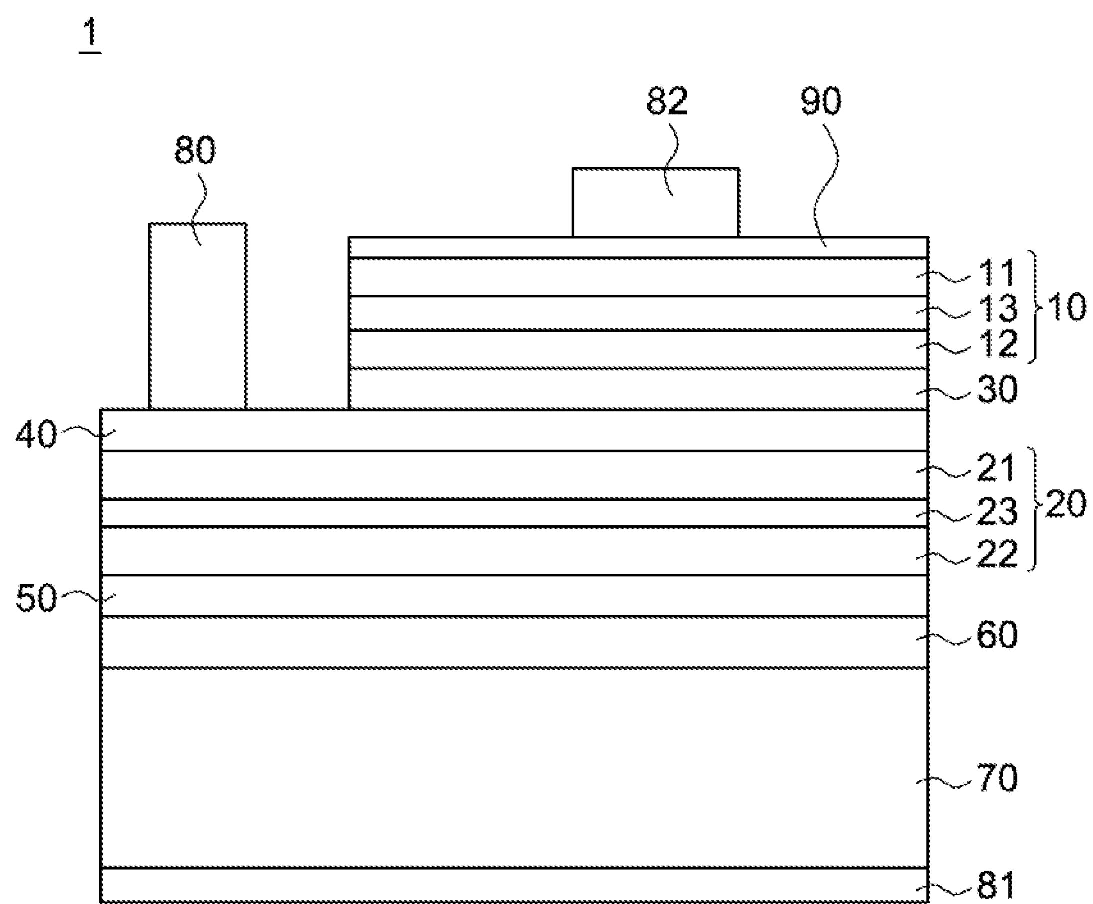
FIG. 2 is a cross-sectional diagram along an A-A' line in FIG. 1.

FIG. 1 is a top view of a light-emitting device 1 in accordance with one embodiment of the present application. FIG. 2 is a cross-sectional diagram along an A-A' line in FIG. 1. As shown in FIG. 1 and FIG. 2, the light-emitting device 1 comprises a first light-emitting semiconductor stack 10 and a second light-emitting semiconductor stack 20, a first Distributed Bragg reflector 30 interposed between the first light-emitting semiconductor stack 10 and the second light-emitting semiconductor stack 20, a first contact layer 40 interposed between the first Distributed Bragg reflector 30 and the second light-emitting semiconductor stack 20, a second contact layer 50 below the second light-emitting semiconductor stack 20, a bonding layer 60 below the second contact layer 50, a permanent substrate 70 below the bonding layer 60, a first electrode 80 above and electrically connected to the first contact layer 40, a second electrode 81 below and electrically connected to the permanent substrate 70, a third contact layer 90 above the first light-emitting semiconductor stack 10, and a third electrode 82 above the third contact layer 90. The first Distributed Bragg reflector 30, the first light-emitting semiconductor stack 10 and the second light-emitting semiconductor stack 20 are on the same side of the permanent substrate 70. In one embodiment, the first light-emitting semiconductor stack 10 and the second light-emitting semiconductor stack 20 are epitaxially grown originally from a growth substrate, and preferably, from the same growth substrate. Specifically, each layer between the second contact layer 50 (included) and the third contact layer 90 (included) is formed by epitaxial growth. Preferably, the third contact layer 90, the first Distributed Bragg reflector 30, the first contact layer 40, and the second contact layer 50 are substantially lattice-matched to the growth substrate, and more preferably, the first light-emitting semiconductor stack 10, which is further to the permanent substrate 70 than the second light-emitting semiconductor stack 20, is also lattice-matched to the growth substrate. In the embodiment of the growth substrate composed of GaAs, each of the layers between the second contact layer 50 (excluded) and the third contact layer 90 (included) comprises a material other than GaP. The method of performing epitaxial growth comprises, but is not limited to metal-organic chemical vapor deposition (MOCVD), hydride vapor phase epitaxial (HYPE) or liquid-phase epitaxy (LPE).

Figure 3:
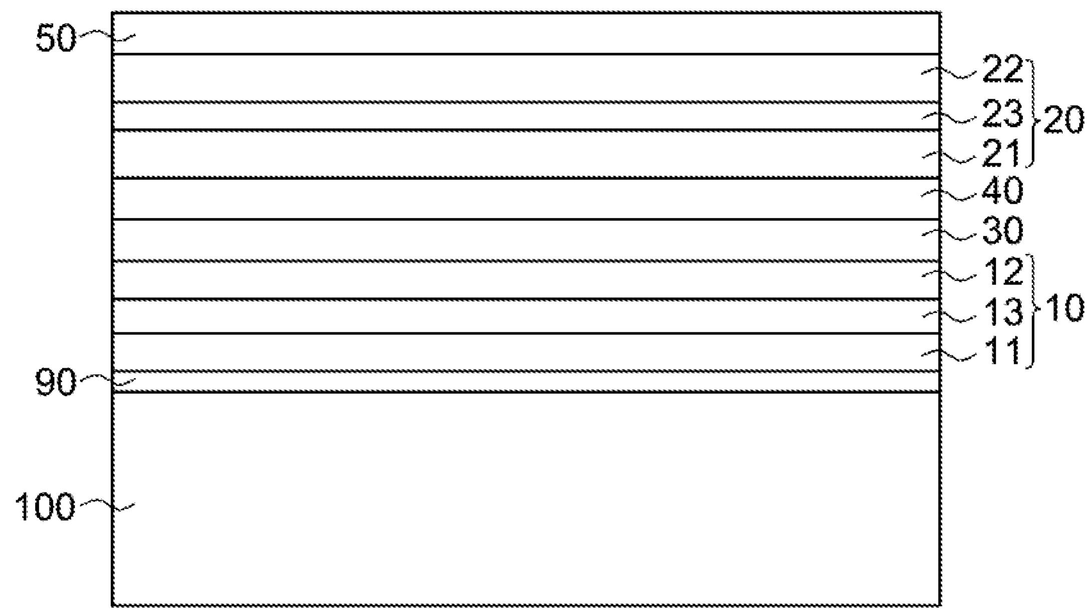
FIGS. 3 through 6 are cross-sectional views of a light-emitting device during a manufacturing process in accordance with one of the embodiments of the present application shown in FIG. 2.
Figure 4:
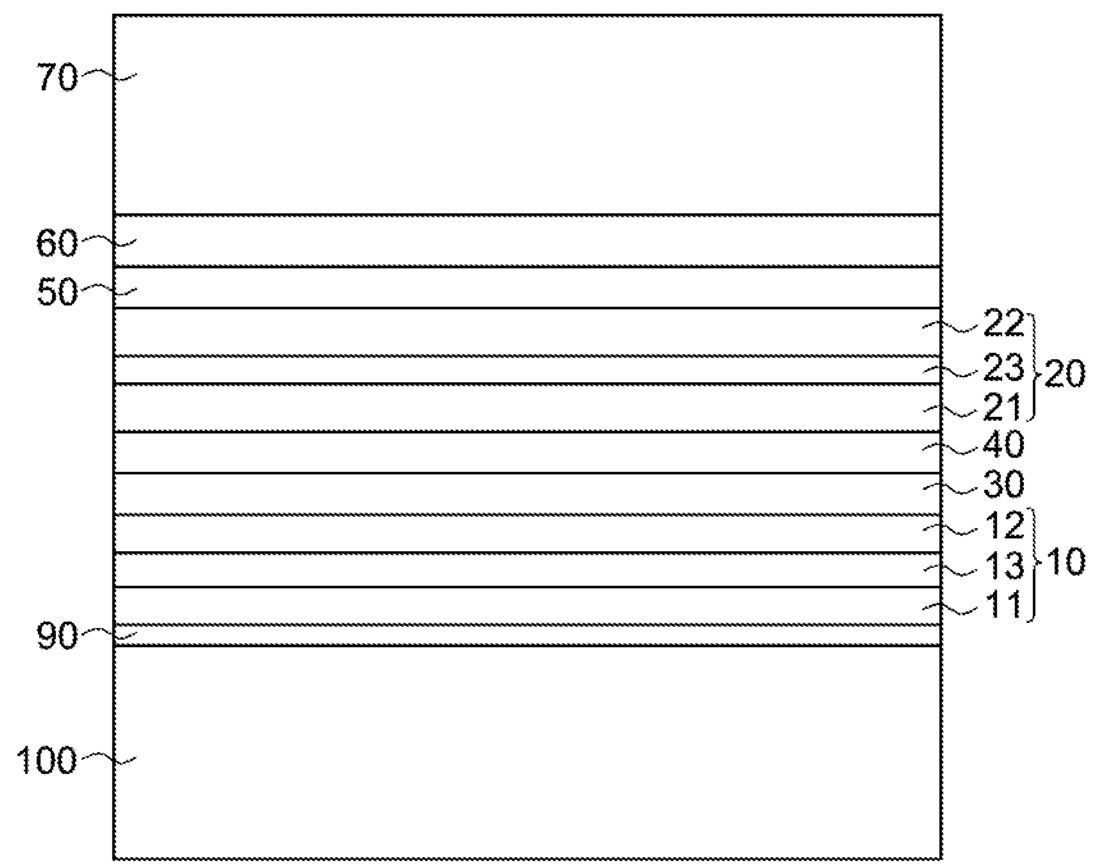
Figure 5:
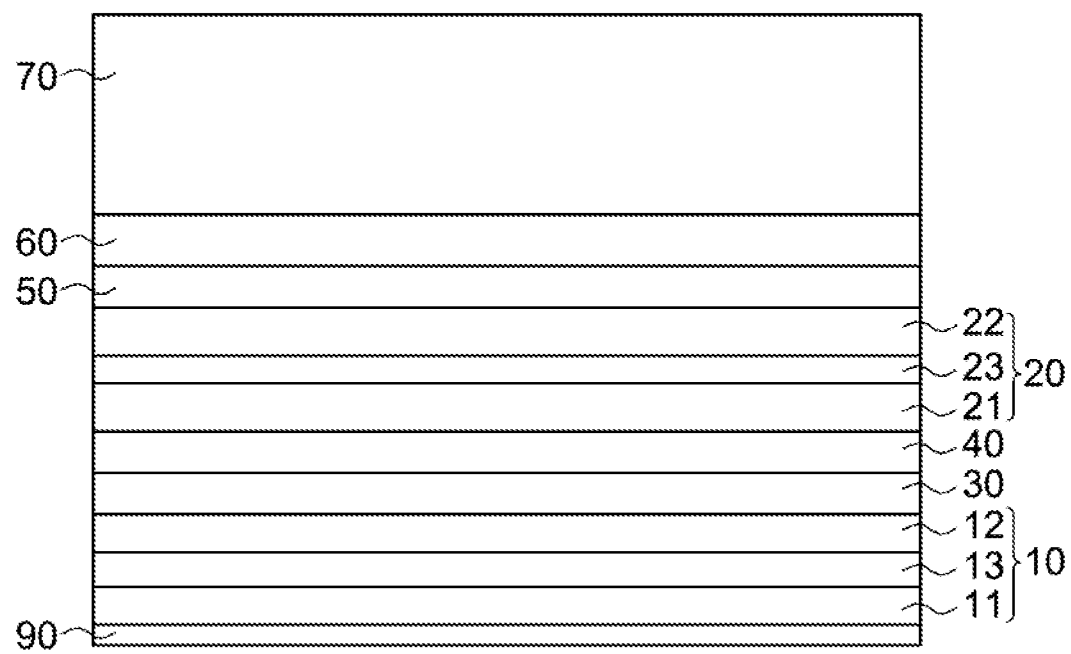
Figure 6:
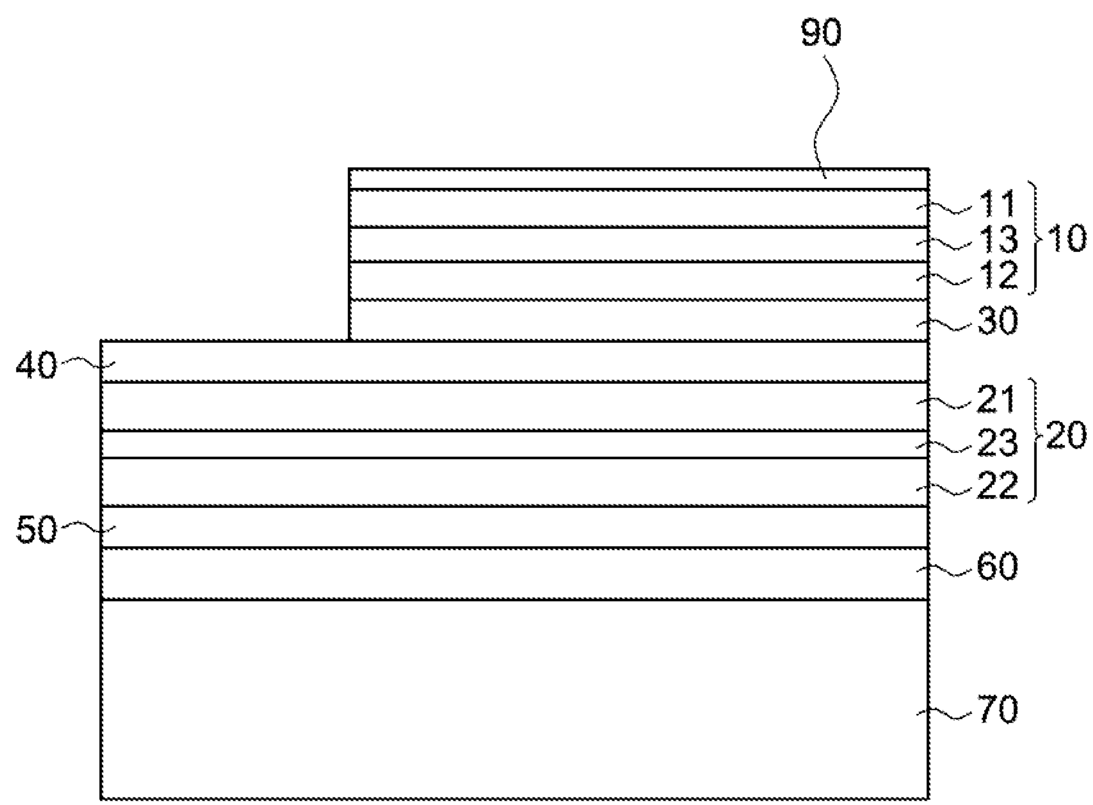

FIGS. 3 through 6 are cross-sectional views of a light-emitting device during a manufacturing process in accordance with one of the embodiments of the present application shown in FIG. 1. As shown in FIG. 3, a method for making the light-emitting device comprises the steps of: providing a growth substrate 100; forming the third contact layer 90 by epitaxial growth; forming the first light-emitting semiconductor stack 10 on the third contact layer 90 by epitaxial growth; forming the first Distributed Bragg reflector 30 on the first light-emitting semiconductor stack 10 by epitaxial growth; forming the first contact layer 40 on the first Distributed Bragg reflector 30 by epitaxial growth; forming the second light-emitting semiconductor stack 20 on the first contact layer 40 by epitaxial growth; and forming the second contact layer 50 on the second light-emitting semiconductor stack 20 by epitaxial growth. As shown in FIGS. 4 through 6, the method for making the light-emitting device further comprises steps of: connecting the second contact layer 50 to a permanent substrate 70 by a bonding layer 60; removing the growth substrate 100 from the third contact layer 90; removing a part of the third contact layer 90, a part of the first light-emitting semiconductor stack 10, an a part of the first Distributed Bragg reflector 30 to expose a part of the first contact layer 40 by lithography and etching process; and forming the first electrode 80 on the first contact layer 40, forming the second electrode 81 below the permanent substrate 70, and forming the third electrode 82 on the third contact layer 90 respectively. Each layer from the first light-emitting semiconductor stack 10 to the second light-emitting semiconductor stack 20 is formed by epitaxial growth and thus complicated connecting steps such as bonding steps between different light-emitting semiconductor stacks are avoided. Therefore, the method of the present application shortens the steps for making the light-emitting device. Besides, because the first Distributed Bragg reflector 30 and the second light-emitting semiconductor stack 20 can be directly formed on the first light-emitting semiconductor stack 10 by epitaxial growth, the first light-emitting semiconductor stack 10, the first Distributed Bragg reflector 30 and the second light-emitting semiconductor stack 20 are on the same side of the growth substrate 100. As a result, it is unnecessary to flip over the growing substrate 100 during epitaxial growth.

Referring to FIG. 2, in the present embodiment, the first light-emitting semiconductor stack 10 comprises a first semiconductor layer 11, a second semiconductor layer 12 and a first active layer 13 interposed between the first semiconductor layer 11 and the second semiconductor layer 12, wherein the conductivity type, the electrical property, the polarity, and/or the dopant of the first semiconductor layer 11 are different from that of the second semiconductor layer 12. In one of the present embodiment, the first semiconductor layer 11 comprises an n-type semiconductor for providing electrons. The second semiconductor layer 12 comprises a p-type semiconductor for providing holes. The first semiconductor layer 11 and the second semiconductor layer 12 comprise a Group III-V semiconductor material, such as AlInP, AlGaInP or AlGaAs. The n-type dopant can be Si or Te. The p type dopant can be C, Zn or Mg. In the present embodiment, the first semiconductor layer 11 and the second semiconductor layer 12 comprises AlInP. The first active layer 13 emits a first radiation of a first dominant wavelength in a visible wavelength range or invisible wavelength range. Preferably, the first dominant wavelength is in the red range. More preferably, the, first dominant wavelength is between 620 nm and 790 nm. The second light-emitting semiconductor stack 20 comprises a third semiconductor layer 21, a fourth semiconductor layer 22 and a second active layer 23 interposed between the third semiconductor layer 21 and the fourth semiconductor layer 22, wherein the conductivity type, the electrical property, the polarity, and/or the dopant of the third semiconductor layer 21 are different from that of the fourth semiconductor layer 22. Preferably, the third semiconductor layer 21 of the second light-emitting semiconductor stack 20, which is closer to the first Distributed Bragg reflector 30 than the fourth semiconductor layer 22, is of the same conductivity type as the second semiconductor layer 12, which is closer to the first Distributed Bragg reflector 30 than the first semiconductor layer 11 of the first light-emitting semiconductor stack 10. In the present embodiment, the third semiconductor layer 21 comprises a p-type semiconductor for providing holes. The fourth semiconductor layer 22 comprises an n-type semiconductor for providing electrons. The third semiconductor layer 21 and the fourth semiconductor layer 22 comprise a Group III-V semiconductor material, such as AlGaAs, AlInP or AlGaInP. The n-type dopant can be Si or Te. The p type dopant can be C, Zn or Mg. In the present embodiment, the third semiconductor layer 21 comprises carbon-doped AlGaAs, and the fourth semiconductor layer 22 comprises Tellurium-doped AlGaAs. Besides, the third semiconductor layer 21 and the fourth semiconductor layer 22 can be a single layer and each has a thickness less than 500 nm, and preferably, between 300 and 500 nm both inclusive. Furthermore, the third semiconductor layer 21 and the fourth semiconductor layer 22 each has a doping concentration between $5*10^{17}/cm^3$ and $5*10^{18}/cm^3$ both inclusive. The second active layer 23 emits a second radiation of a second dominant wavelength longer than the first dominant wavelength. Preferably, the second dominant wavelength is in an invisible wavelength range. More preferably, the second dominant wavelength is between 790 nm and 1500 nm both inclusive. The structure of the first active layer 13 and the second active layer 23 each can be single heterostructure (SH), double heterostructure (DH), double-side double heterostructure (DDH) or multi-quantum well (MQW), wherein the first dominant wavelength and the second dominant wavelength can be changed by adjusting the composition and the thickness of the first active layer 13 or the second active layer 23. The material of the first active layer 13 and the second active layer 23 comprises a Group III-V semiconductor material, for example, the first active layer 12 comprises alternate well layers composed of InGaP and barrier layers composed of AlGaInP, and the second active layer 23 comprises alternate well layers composed of InGaAs and barrier layers composed of AlGaAsP. In the present embodiment, the third contact layer 90 has a light exit surface (not labeled) opposite to the permanent substrate 70, and the light emitted from the first active layer 13 and the light emitted from the second active layer 23 are escaped from the light-emitting device 1 mainly through the light exit surface of the third contact layer 90. The first active layer 13 is closer to the light exit surface of the third contact layer 90 than to the second active layer 23 for preventing the first radiation emitted by the first active layer 13 from being absorbed by the second active layer 23.

Referring to FIG. 2, in the present embodiments, the first Distributed Bragg reflector 30 is electrically conductive and has a higher reflectivity to the first dominant wavelength than to the second dominant wavelength. That is to say, the Distributed Bragg reflector 30 reflects more first radiation than the second radiation. Specifically, the difference between the reflectivity of the Distributed Bragg reflector 30 to the first dominant wavelength and the reflectivity to the second dominant wavelength is greater than 30%, and preferably greater than 40%, and more preferably greater than 50%. Specifically, the Distributed Bragg reflector 30 has a transmittance to the second dominant wavelength greater than 30%, and preferably greater than 50%, and more preferably greater than 80%. To be more specific, a wavelength range with reflectivity greater than 50% of the first Distributed Bragg reflector 30 does not overlap the second dominant wavelength, and preferably, a wavelength range with reflectivity greater than 80% of the first Distributed Bragg reflector 30 does not overlap the second dominant wavelength, and more preferably, a wavelength range with reflectivity greater than 90% of the first Distributed Bragg reflector 30 does not overlap the second dominant wavelength, wherein the wavelength range can be changed by adjusting the material or the thickness of the first semiconductor layers, the thickness of the second semiconductor layers, or the pair number of the first semiconductor layers and the second semiconductor layers, wherein a first semiconductor layer and a second semiconductor layer are considered as a pair. The first active layer 13 is closer to the first Distributed Bragg reflector 30 than to the first contact layer 40. The first Distributed Bragg reflector 30, the first contact layer 40, the second semiconductor layer 12, and the third semiconductor layer 21 are of the same conductivity type. In the present embodiment, the first Distributed Bragg reflector 30 is a p-type semiconductor. Besides, the transverse width of the first Distributed Bragg reflector 30 is less than the transverse width of the second light-emitting semiconductor stack 20, and less than the transverse width of the first contact layer 40. The first Distributed Bragg reflector 30 comprises alternate first semiconductor layers and second semiconductor layers, wherein the refractive index and the thickness of the first semiconductor layers are different from that of the second semiconductor layers. The material of the first Distributed Bragg reflector 30 comprises a Group III-V semiconductor material, such as $Al_xGa_{(1-x)}As/Al_yGa_{(1-y)}As$ (wherein x is different from y) or AlInP/AlGaInP, wherein the content of Al and Ga and the content of Al and In can be adjusted for reflecting a predetermined wavelength range.

Referring to FIG. 2, in the present embodiments, the second light-emitting semiconductor stack 20 is closer to the first contact layer 40 than to the first Distributed Bragg reflector 30. The first electrode 80 is electrically commonly connected to the first light-emitting semiconductor stack 10 and the second light-emitting semiconductor stack 20 through the first contact layer 40 for forming ohmic contacts between the first electrode 80 and the first light-emitting semiconductor stack 10 and between the first electrode 80 and the second light-emitting semiconductor stack 20. The first contact layer 40, the second semiconductor layer 12, and the third semiconductor layer 21 are of the same conductivity type. In the present embodiment, the first contact layer 40 is a p-type semiconductor. The thickness of the first contact layer 40 is less than 1 um and preferably, less than 500 nm, and more preferably, between 50 and 100 nm both inclusive for reducing light absorption by the first contact layer 40. The doping concentration of the first contact layer 40 is greater than $10^{19}/cm^3$, and preferably, between $1*10^{19}/cm^3$ and $5*10^{19}/cm^3$ both inclusive. The material of the first contact layer 40 comprises a Group III-V semiconductor material, such as GaAs, AlGaAs, InGaP or AlGaInP. The dopant of the first contact layer 40 can be Zn or Carbon. In the present embodiment, the material of the first contact layer 40 comprises carbon-doped GaAs.

Referring to FIG. 2, in the present embodiments, the second contact layer 50 and the third contact layer 90 are of the same conductivity type, wherein the second electrode 81 is electrically connected to the second light-emitting semiconductor stack 20 through the second contact layer 50 for achieving ohmic behavior between the second electrode 81 and the second light-emitting semiconductor stack 20, and wherein the third electrode 82 is electrically connected to the first light-emitting semiconductor stack 10 through the third contact layer 90 for achieving ohmic behavior between the third electrode 82 and the first light-emitting semiconductor stack 10. In the present embodiment, the second contact layer 50 and the third contact layer 90 are n-type semiconductors. The thickness of the second contact layer 50 is less than 1 um, and preferably, less than 500 nm, and more preferably, between 50 and 100 nm both inclusive for reducing light absorption by the second contact layer 50. The doping concentration of the second contact layer 50 is greater than $10^{18}/cm^3$, and preferably, between $5*10^{18}/cm^3$ and $5*10^{19}/cm^3$ both inclusive. The material of the second contact layer 50 comprises a Group III-V semiconductor material, such as GaAs, AlGaAs, InGaP or AlGaInP. The thickness of the third contact layer 90 is less than 1 um, and preferably, less than 500 nm, and more preferably, between 50 and 100 nm both inclusive for reducing light absorption by the third contact layer 90. The doping concentration of the third contact layer 90 is greater than $10^{19}/cm^3$, and preferably between $5*10^{18}/cm^3$ and $5*10^{19}/cm^3$ both inclusive. The material of the third contact layer 90 comprises a Group III-V semiconductor material, such as GaAs, AlGaAs, InGaP or AlGaInP. In the present embodiment, the material of the third contact layer 90 comprises silicon-doped GaAs.

Referring to FIG. 2, in the present embodiments, the bonding layer 60 is for connecting the second contact layer 50 to the permanent substrate 70. The bonding layer 60 is electrically conductive and comprises a metal material selected from the group consisting of In, Au, Sn, Pb, InAu, SnAu, and the alloys thereof.

Referring to FIG. 2, in the present embodiments, the permanent substrate 70 is electrically conductive for conducting a current flowing between the first electrode 80 and the second electrode 81 and conducting a current flowing between the second electrode 81 and the third electrode 82. The permanent substrate 70 has a thickness thick enough for supporting the layers or structures thereon. The material of the permanent substrate 70 comprises a conductive material or preferably a transparent conductive material. The conductive material comprises Si, Cu, Al, Mo, Sn, Zn, Cd, Ni, Co, diamond like carbon (DLC), graphite, carbon fiber, metal matrix composite (MMC) or ceramic matrix composite (CMC).

Referring to FIG. 2, the first electrode 80, the second electrode 81, and the third electrode 82 are for electrically connected to an external power source for independently driving the first light-emitting semiconductor stack 10 and the second light-emitting semiconductor stack 20. In one embodiment, under an driving condition of the first electrode 80 being positive and the second electrode 81 and the third electrode 82 being negative, the first light-emitting semiconductor stack 10 is forward biased by the first electrode 80 and the third electrode 82; meanwhile, the second light-emitting semiconductor stack 20 is forward biased by the first electrode 80 and the second electrode 81. Therefore, the first electrode 80 and the first contact layer 40 are electrically common to the first light-emitting semiconductor stack 10 and the second light-emitting semiconductor stack 20. Besides, the first light-emitting semiconductor stack 10 and the second light-emitting semiconductor stack 20 can be operated independently, therefore the applied voltages across the first light-emitting semiconductor stack 10 and the second light-emitting semiconductor stack 20 can be different. The material of the first electrode 80, second electrode 81 and the third electrode 82 comprises transparent conductive material or metal material, wherein the transparent conductive material comprises transparent conductive oxide, and wherein the metal material includes Cu, Sn, Au, Ni, Pt, Al, Ti, Cr, Pb, Cu—Sn, Cu—Zn, Cu—Cd, Sn—Pb—Sb, Sn—Pb—Zn, Ni—Sn, Ni—Co, Au alloy, Au—Cu—Ni—Au or combinations thereof.

Figure 7:
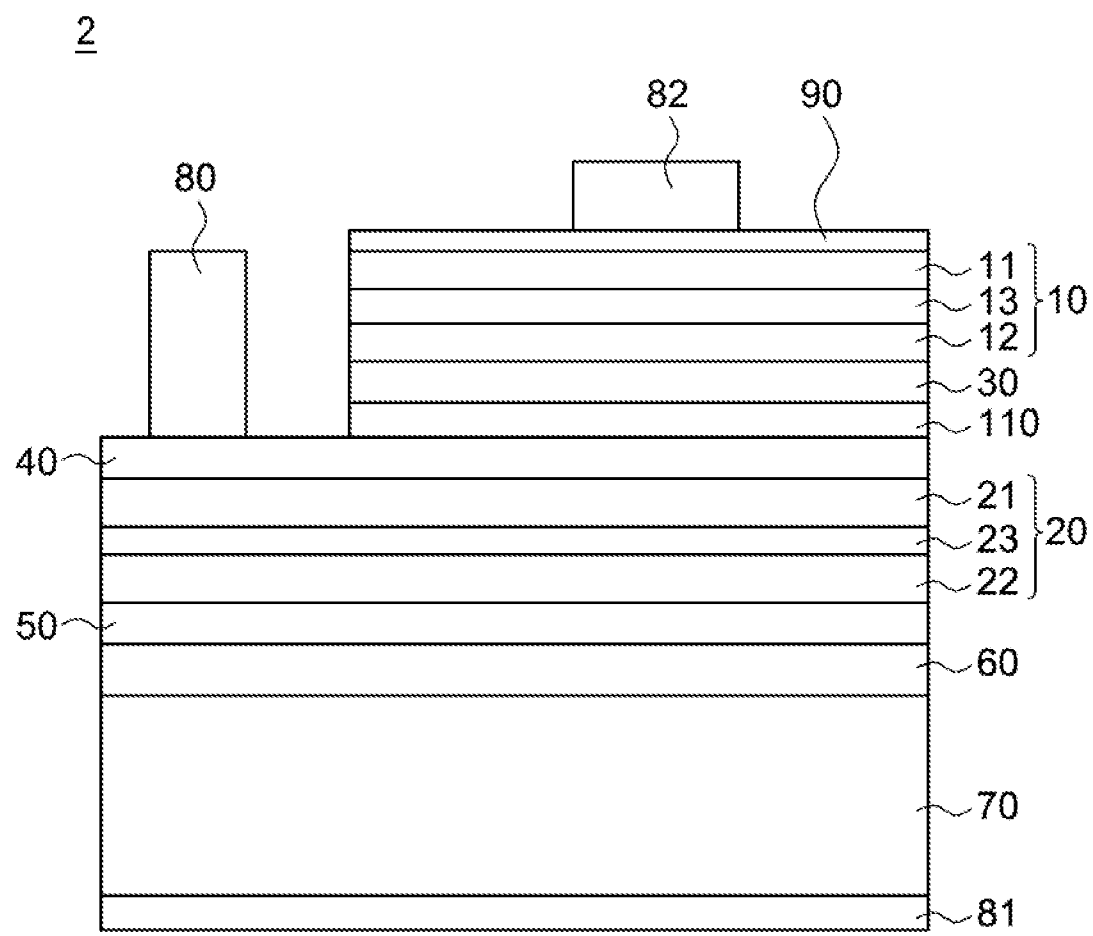
FIG. 7 is a cross-sectional diagram along an A-A' line in FIG. 1.
Figure 8:
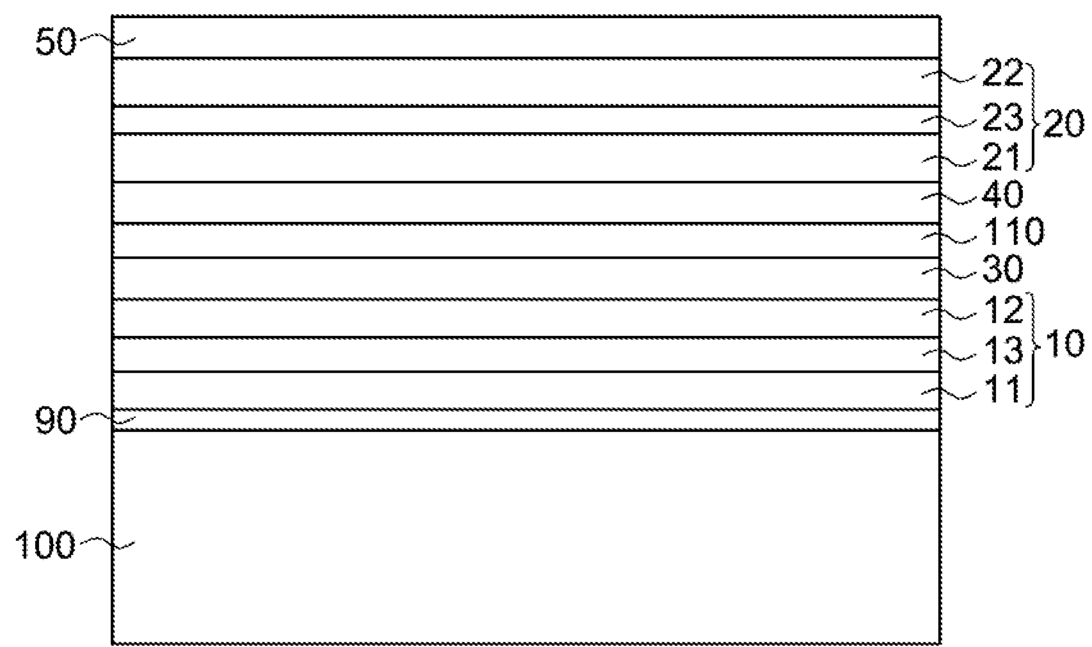
FIG. 8 is a cross-sectional view of a light-emitting device during a manufacturing process in accordance with one of the embodiments of the present application shown in FIG. 7.

FIG. 7 shows another embodiment of a light-emitting device 2 in accordance with the present disclosure. The light-emitting device 2 comprises substantially the same structure as shown in FIG. 2, and further comprises a protecting layer 110 between the first Distributed Bragg reflector 30 and the first contact layer 40. Preferably, the protecting layer 110 is also lattice-matched to the growth substrate. In the embodiment of the growth substrate composed of GaAs, each of the layers between the second contact layer 50 (excluded) and the third contact layer 90 (included) comprises a material other than GaP. The method for making the light-emitting device 2 comprises the steps substantially the same as the method for making the light-emitting device 1, and further comprises a step of forming the protecting layer 110 on the first Distributed Bragg reflector 30 by epitaxial growth before the step of forming the first contact layer 40 as shown in FIG. 8. In the present embodiment, the second semiconductor layer 12 has a first band gap and the third semiconductor layer 21 has a second band gap. The protecting layer 110 has a third band gap between the first band gap and the second band gap. The protecting layer 110 is electrically conductive and is of the same conductivity type as the first contact layer 40. In the present embodiment, the protecting layer 110 is a p-type semiconductor. The protecting layer 110 has a thickness less than 1 um, and preferably, less than 500 nm, and more preferably, between 50 nm and 100 nm both inclusive. Preferably, the protecting layer 110 has a doping concentration between $1*10^{17}/cm^3$ and $1*10^{19}/cm^3$ both inclusive. The material of the protecting layer 110 comprises a Group III-V semiconductor material, such as AlInP, AlGaInP, or InGaP. Because the first dominant wavelength of first active layer 21 and the second dominant wavelength of second active layer 23 are different, the material of the first light-emitting semiconductor stack 10 and the second light-emitting semiconductor stack 20 are different. Therefore, the epitaxial system for growing the first light-emitting semiconductor stack 10 is different from that of the second light-emitting semiconductor stack 20. During the process of changing the epitaxial system chamber, the protecting layer 110 is for preventing the layers between the growth substrate 100 and first Distributed Bragg reflector 30 from oxidization and deterioration. Specifically, the protecting layer 110 comprises Al and has an Al composition ratio less than the Al composition ratio of the layer which the protecting layer 110 is directly grown on. In another embodiment, the protecting layer 110 is directly grown on the Distributed Bragg reflector 30 comprising Al, and the protecting layer 110 comprises InGaP and is substantially devoid of Al. Furthermore, the following epitaxial layers such as the first contact layer 40 which is directly formed on the protecting layer 110 by epitaxial growth is substantially lattice-matched to the protecting layer 110.

Figure 9:
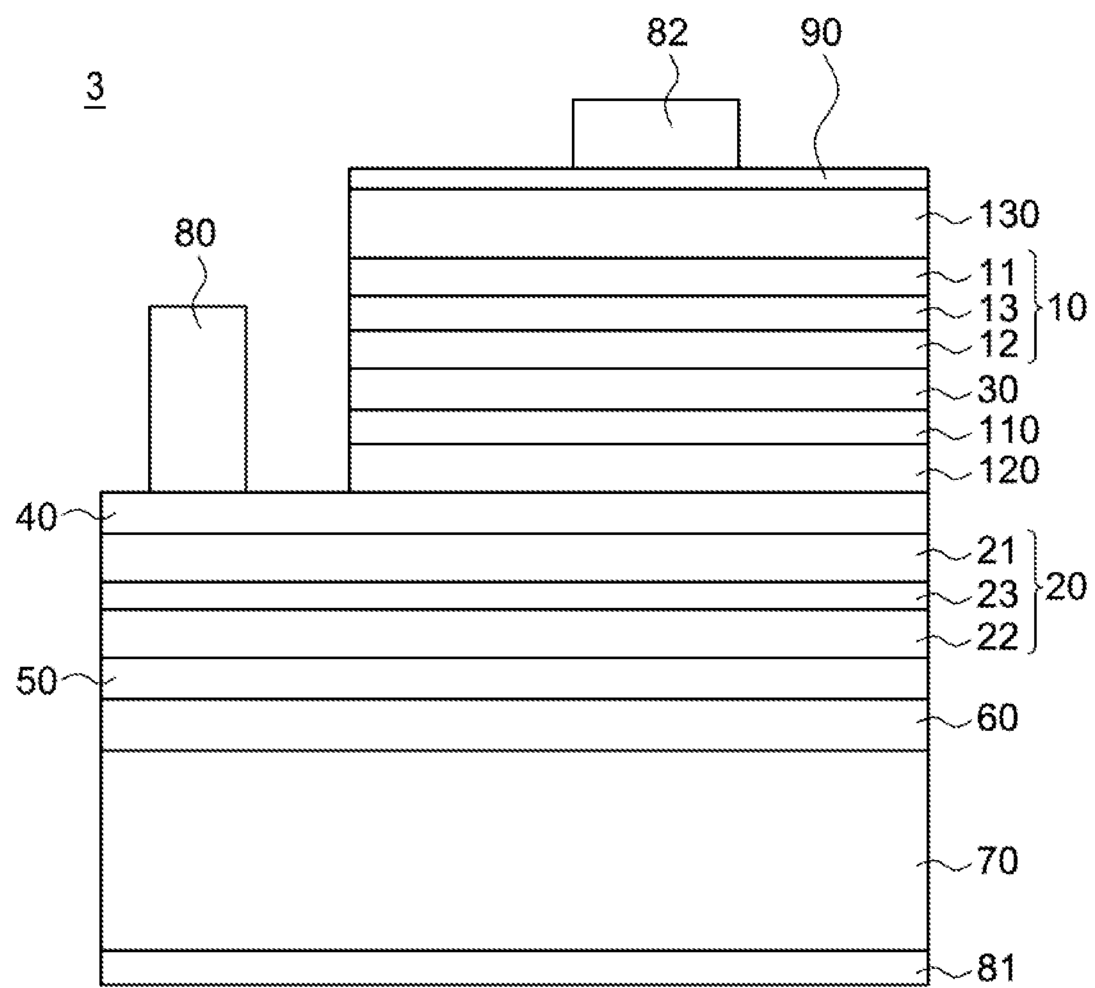
FIG. 9 is a cross-sectional diagram along an A-A' line in FIG. 1.
Figure 10:
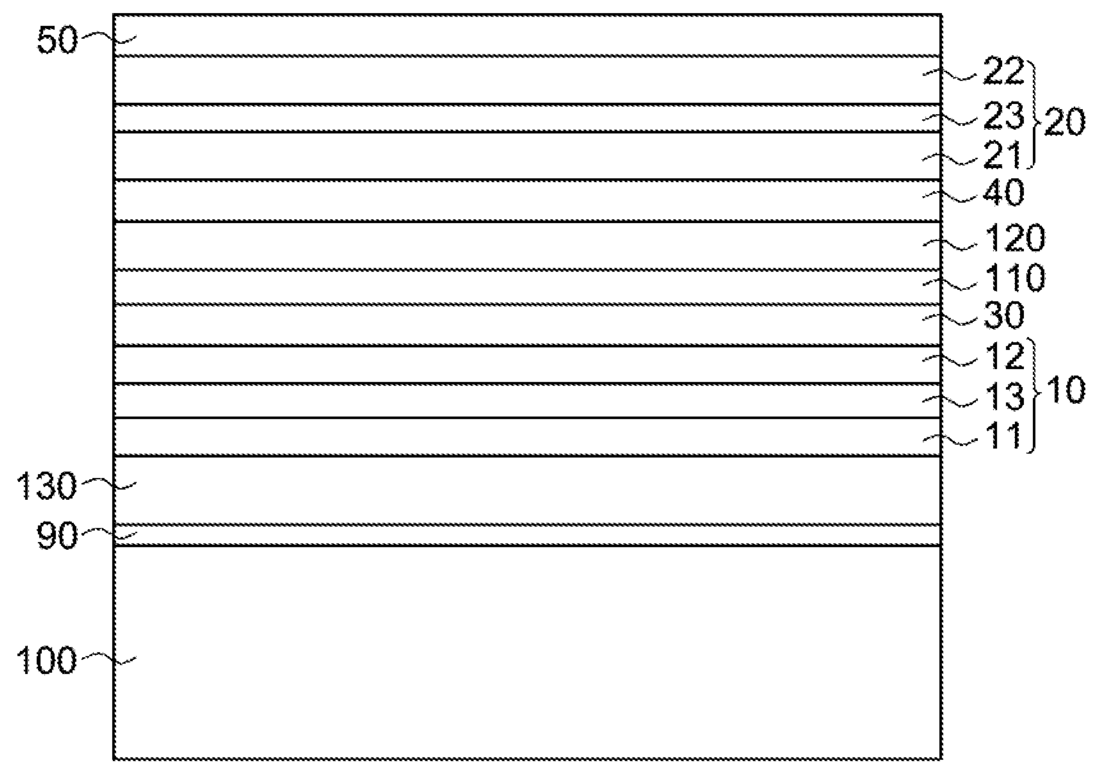
FIG. 10 is a cross-sectional view of a light-emitting device during a manufacturing process in accordance with one of the embodiments of the present application shown in FIG. 9.

FIG. 9 shows another embodiment of a light-emitting device 3 in accordance with the present disclosure. The light-emitting device 3 comprises substantially the same structure as shown in FIG. 7, and further comprises a first current spreading layer 120 between the protecting layer 110 and the first contact layer 40, a second current spreading layer 130 between the third contact layer 90 and the first light-emitting semiconductor stack 10. Preferably, the first current spreading layer 120 and the second current spreading layer 130 are also lattice-matched to the growth substrate. In the embodiment of the growth substrate composed of GaAs, each of the layers between the second contact layer 50 (excluded) and the third contact layer 90 (included) comprises a material other than GaP. Furthermore, in the present embodiment, the third semiconductor layer 21 and the fourth semiconductor layer 22 of the second light-emitting semiconductor stack 20 each has a thickness between 500 nm and 5000 nm so as to act as a cladding layer and a current spreading layer for the second light-emitting semiconductor stack 20 at the same time. The method for making the light-emitting device 3 comprises the steps substantially the same as the method for making the light-emitting device 2, and further comprises the steps of forming the second current spreading layer 130 on the third contact layer 90 by epitaxial growth before the step of forming the first light-emitting semiconductor stack 10; and forming the first current spreading layer 120 on the protecting layer 110 by epitaxial growth before the step of forming the first contact layer 40 as shown in FIG. 10. The first current spreading layer 120 is of the same conductivity type as the first contact layer 40. In the present embodiment, the first current spreading layer 120 is a p-type semiconductor. The first current spreading layer 120 comprises a Group III-V semiconductor material, such as AlGaAs. In the present embodiment, the material of the first current spreading layer 120 comprises carbon-doped AlGaAs. The second current spreading layer 130 comprises a Group III-V semiconductor material, such as AlGaInP. The first current spreading layer 120 and the second current spreading layer 130 are for spreading the current more uniformly through the first light-emitting semiconductor stack 10. The third semiconductor layer 21 and the fourth semiconductor layer 22 are for spreading the current more uniformly through the second light-emitting semiconductor stack 20. In one of the embodiments, the light-emitting device comprises one of the first and the second current spreading layers instead of comprising both of them.

Figure 11:
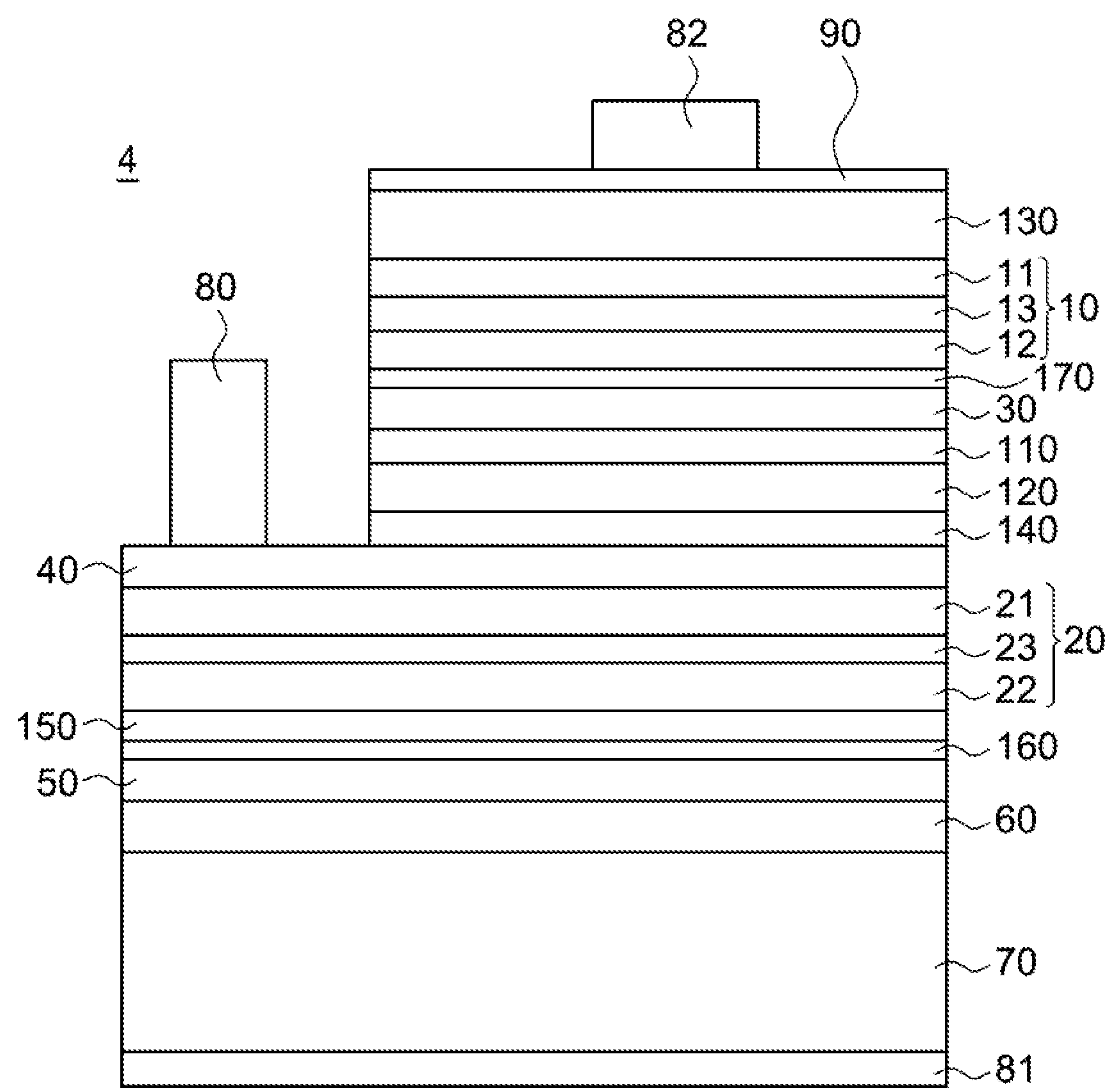
FIG. 11 is a cross-sectional diagram along an A-A' line in FIG. 1.
Figure 12:
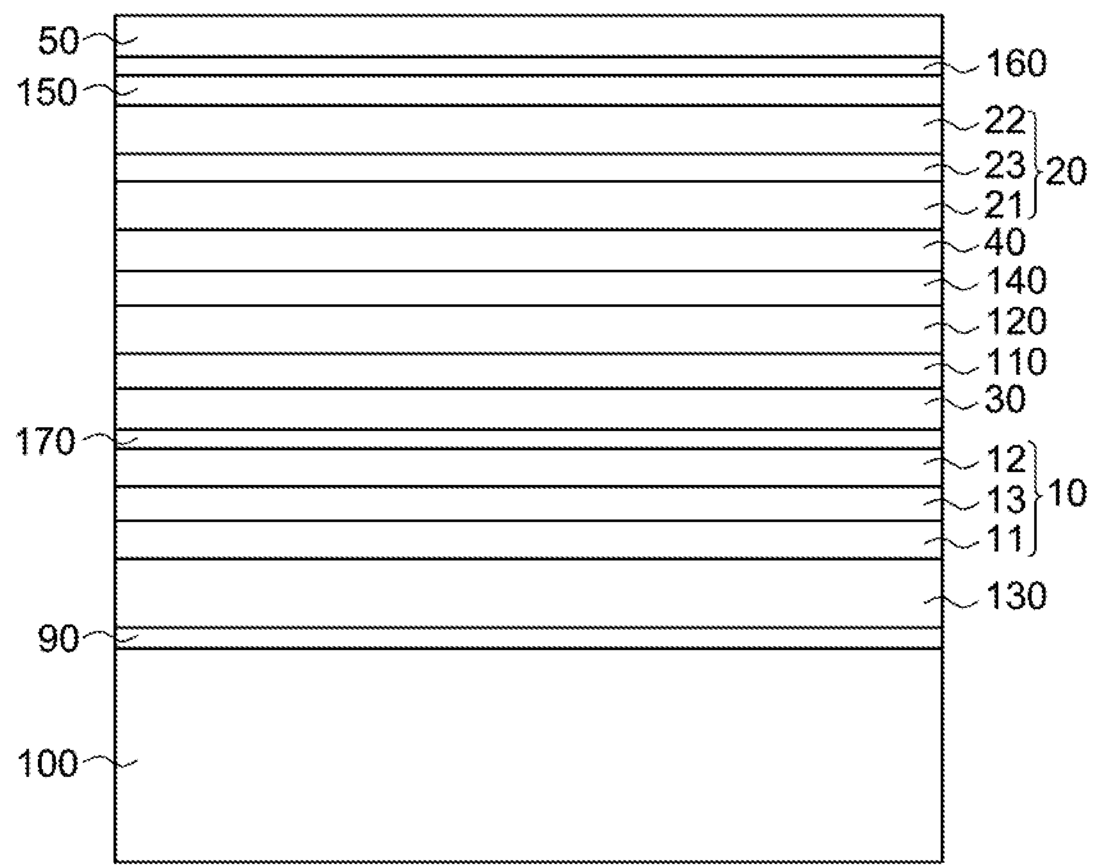
FIG. 12 is a cross-sectional view of a light-emitting device during a manufacturing process in accordance with one of the embodiments of the present application shown in FIG. 11.

FIG. 11 shows another embodiment of a light-emitting device 4 in accordance with the present disclosure. The light-emitting device 4 comprises substantially the same structure as the light-emitting device 3 described in FIG. 9 and the description thereof, and the light-emitting device 4 optionally comprises an etching stop layer 140 between the first contact layer 40 and the first current spreading layer 120. Preferably, the etching stop layer 140 is also lattice-matched to the growth substrate. In the embodiment of the growth substrate composed of GaAs, each of the layers between the second contact layer 50 (excluded) and the third contact layer 90 (included) comprises a material other than GaP. The method for making the light-emitting device comprises the steps substantially the same as the method for making the light-emitting device 3 as described in FIG. 9 and the description thereof, and optionally comprises a step of forming the etching stop layer 140 on the first current spreading layer 120 by epitaxial growth before the step of forming the first contact layer 40 as shown in FIG. 12. The etching stop layer 140 is electrically conductive and is of the same conductivity type as the first contact layer 40. In the present embodiment, the etching stop layer 140 is a p-type semiconductor. The etching stop layer 140 has a thickness between 50 nm and 100 nm both inclusive, and has a doping concentration between $1*10^{17}/cm^3$ and $1*10^{19}/cm^3$ both inclusive. The material of the etching stop layer 140 comprises a Group III-V semiconductor material, such as AlInP, AlGaInP, or InGaP. The material of the etching stop layer 140 may be the same or different from the protecting layer 110. The etching stop layer 140 is for preventing from over-etching the first contact layer 40 during the step of removing a part of the third contact layer 90, a part of the second current spreading layer 130, a part of the first light-emitting semiconductor stack 10, a part of the first Distributed Bragg reflector 30, a part of the protecting layer 110 and a part of the first current spreading layer 120 to expose a part of the first contact layer 40.

In one embodiment, the first dominant wavelength of the first radiation and the second dominant wavelength of the second radiation are both greater than 600 nm. Preferably, the first radiation is red light, and the second radiation is infra-red light. Specifically, the first dominant wavelength of the first radiation is between 650 nm and 670 nm, and the second dominant wavelength of the second radiation is between 795 nm and 815 nm or between 930 nm and 950 nm. More specifically, the first dominant wavelength of the first radiation is about 660 nm. The second dominant wavelength of the second radiation is about 805 nm or about 940 nm. The first Distributed Bragg reflector 30 reflects the first radiation and is substantially transparent to the second radiation. The material of the first Distributed Bragg reflector 30 comprises $Al_xGa_{(1-x)}As/Al_yGa_{(1-y)}As$ or AlInP/$Al_zIn_{(1-z)}GaP$, wherein x is between 0.7 and 1 both inclusive, y is between 0.4 and 0.6 both inclusive, and preferably, is between 0.3 and 0.5, and z is between 5 and 10 both inclusive for reflecting the first radiation. The first active layer 13 and the second active layer 23 may operate independently. Specifically, the first active layer 13 is operated by controlling the first electrode 80 and the third electrode 82. The second active layer 23 is operated by controlling the first electrode 80 and the second electrode 81. The light-emitting device is a monolithic die comprising multiple light-emitting semiconductors with different wavelengths used for multiple functions. As a result, a monolithic die comprising multiple light-emitting diodes emitting different dominant wavelengths in a single package is achieved, and therefore the volume of the light-emitting device is significantly reduced. Furthermore, because the light-emitting device is a monolithical single chip featured with dual dominant wavelengths while independently driving the first active layer 13 and the second active layer 23, the light-emitting device of the present embodiment may be applicable in biomedical field as wearable devices such as pulse oximeters for monitoring blood oxygen saturation (SpO2) and detecting hemoglobin by alternately or periodically driving the first light-emitting semiconductor stack 10 and the second light-emitting semiconductor stack 20.

Referring to FIG. 11, the light-emitting device 4 further comprises a second Distributed Bragg reflector 150 between the second contact layer 50 and the fourth semiconductor layer 22. Preferably, the second Distributed Bragg reflector 150 is also lattice-matched to the growth substrate. Referring to FIG. 12, the method for making the light-emitting device 4 of FIG. 11 further comprises a step of forming the second Distributed Bragg reflector 150 on the fourth semiconductor layer 22 by epitaxial growth before the step of forming the second contact layer 50. The second Distributed Bragg reflector 150 is for reflecting the second radiation. The transverse width of the second Distributed Bragg reflector 150 is greater than the transverse width of the first Distributed Bragg reflector 30, and is substantially the same as the transverse width of the second light-emitting semiconductor stack 20. The second Distributed Bragg reflector 150 comprises alternate third semiconductor layers and fourth semiconductor layers, wherein the refractive index and the thickness of the third semiconductor layers are different from that of the fourth semiconductor layers. The material of the second Distributed Bragg reflector 150 comprises a Group III-V semiconductor material, such as $Al_xGa_{(1-x)}As/Al_yGa_{(1-y)}As$ (wherein x is different from y), AlAs/GaAs, AlInP/InGaP or $Al_uIn_{(1-u-v)}Ga_vP/Al_rIn_{(1-r-s)}Ga_sP$ (wherein u is different from r). The second Distributed Bragg reflector reflects radiation in a wavelength range overlapping the second dominant wavelength, and the wavelength range can be changed by adjusting the material, the thickness of the third semiconductor layers, the thickness of the fourth semiconductor layers and the pair number of the third semiconductor layers and the fourth semiconductor layers, wherein a third semiconductor layer and a fourth semiconductor layer are considered as a pair. The second Distributed Bragg reflector 150 can be also applied to the foregoing embodiment depicted in FIG. 2 to FIG. 10.

Referring to FIG. 11, in one of the embodiments, the light-emitting device 4 optionally comprises a buffer layer 160 between the fourth semiconductor layer 22 and the second contact layer 50. In one embodiment, the buffer layer 160 is between the second Distributed Bragg reflector 150 and the second contact layer 50. The method for making the light-emitting device 4 further comprises a step of forming the buffer layer 160 on the second Distributed Bragg reflector 150 by epitaxial growth before the step of forming the second contact layer 50. The band gap of the buffer layer 160 is between the band gap of the fourth semiconductor layer 22 and the band gap of the second contact layer 50. The lattice constant of the buffer layer 160 is between the lattice constant of the fourth semiconductor layer 22 and the lattice constant of the second contact layer 50. The buffer layer 160 has a thickness between 10 nm and 500 nm both inclusive, and has a doping concentration between $1*10^{17}/cm^3$ and $1*10^{19}/cm^3$ both inclusive. The material of the buffer layer 160 comprises a Group III-V semiconductor material, such as InGaP or AlGaInP. In the present embodiment, the material of the buffer layer 160 comprises silicon-doped InGaP. The buffer layer 160 can be also applied to the foregoing embodiment depicted in FIG. 2 to FIG. 10.

Referring to FIG. 11, the light-emitting device 4 optionally comprises an intermediate layer 170 disposed between the second semiconductor layer 12 and the first Distributed Bragg reflector 30. If the material of the second semiconductor layer 12 and the material of the first Distributed Bragg reflector 30 are different from the material of the protecting layer 110, the intermediate layer 170 comprises an element having a composition ratio transiting from the side near the second semiconductor layer 12 to the side near the protecting layer 110, and thus the intermediate layer 170 comprises the same element as in the material of the protecting layer 110 and as in the material of the second semiconductor layer 12. For example, if the material of the second semiconductor layer 12 comprises AlInP, the material of the first Distributed Bragg reflector 30 comprises $Al_xGa_{(1-x)}As/Al_yGa_{(1-y)}As$ (wherein x is different from y), and the material of the protecting layer 110 comprises InGaP, the intermediate layer 170 comprising AlGaInP is interposed between the second semiconductor layer 12 and the first Distributed Bragg reflector 30. Preferably, the material of the intermediate layer 170 has a band gap between the band gap of the second semiconductor layer 12 and the band gap of the protecting layer 110, and more preferably, the intermediate layer 170 has a lattice constant substantially the same as that of the second semiconductor layer 12 and that of the protecting layer 110. The method for making the light-emitting device optionally comprises a step of forming the intermediate layer 170 on the first light-emitting semiconductor stack 10 before the step of forming the first Distributed Bragg reflector 30. Preferably, the intermediate layer 170, the protecting layer 110, the first Distributed Bragg reflector 30 and the first contact layer 40 have the same conductivity type. The intermediate layer 170 has a thickness between 0 nm and 30 nm. The intermediate layer 170 is for transiting the material of the first light-emitting semiconductor stack 10 to another material, such as of the protecting layer 110, and is advantageous for reducing forward bias ($V_f$) of the light-emitting device 4. Specifically, in one embodiment of the present disclosure, the compositions of the intermediate layer 170 is gradually changed and the lattice constant of the intermediate layer 170 is also gradually changed from the side connected to the second semiconductor layer 12 to the side connected to first Distributed Bragg reflector 30 accordingly such that the intermediate layer 170 is substantially lattice-matched to both the second semiconductor layer 12 and the first Distributed Bragg reflector 30 at the interfaces respectively. In one embodiment, the intermediate layer 170 comprises a material of AlGaInP of which the Al content is gradually decreased and the Ga content is gradually increased at a direction from the second semiconductor layer 12 toward the first Distributed Bragg reflector 30. The intermediate layer 170 can be also applied to the foregoing embodiment depicted in FIG. 7 to FIG. 10.

Figure 13:
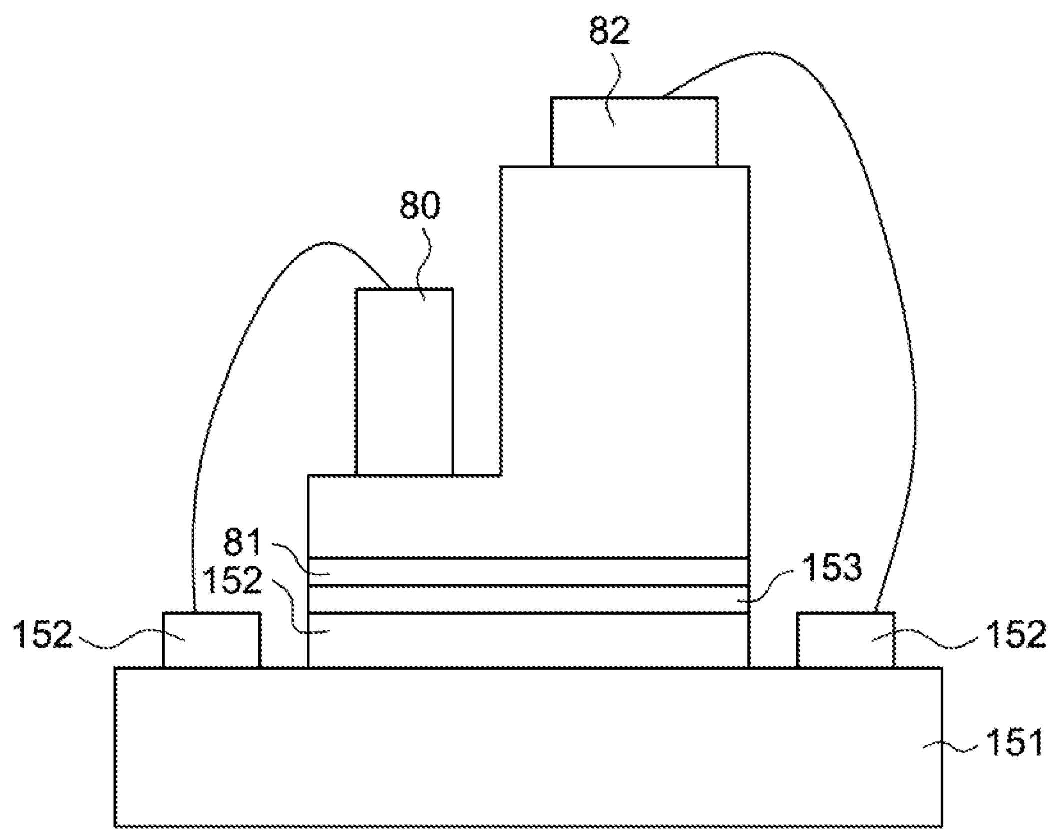
FIG. 13 is a cross-sectional view of a light-emitting structure in accordance with one of the embodiments of the present application.
Figure 14:
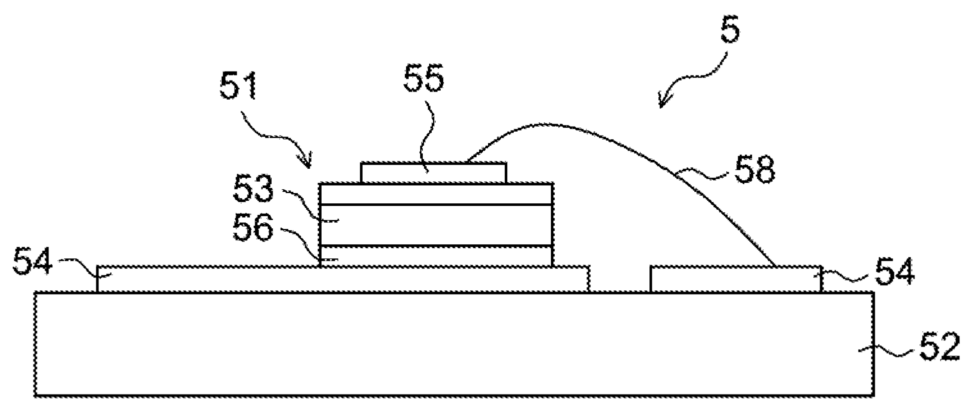
FIG. 14 shows a conventional light-emitting device.

The light-emitting devices as mentioned above are able to combine with other downstream structures to form a light-emitting module. As shown in FIG. 13, the light-emitting module comprises a submount 151 comprising multiple separated electrical connectors 152; a solder 153 on the submount 151, wherein the solder 153 is used for affixing the light-emitting device of the present application to the submount 151, and thus the solder 153 renders the second electrode 81 of the light-emitting device electrically connected to one of the electrical connectors 152 of the submount 151. The first electrode 80 and the third electrode 82 are electrically connected to the other two electrical connectors 152 by any methods such as wire bonding.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:

a substrate;

a first light-emitting semiconductor stack on the substrate and comprising a first active layer emitting a first radiation of a first wavelength;

a second light-emitting semiconductor stack on the first light-emitting semiconductor stack and comprising a second active layer emitting a second radiation of a second wavelength;

an intermediate layer between the first light-emitting semiconductor stack and the second light-emitting semiconductor stack, wherein the intermediate layer has a first side and a second side and comprises an element having a composition ratio transiting from the first side to the second side;

a semiconductor layer between the intermediate layer and the second light-emitting semiconductor stack, and a first electrode electrically connected to the first light-emitting semiconductor stack, and having a first pad and a first extension part extended from the first pad.

2. The light-emitting device according to claim 1, wherein the semiconductor layer comprises Al.

3. The light-emitting device according to claim 1, further comprising a first contact layer between the first light-emitting semiconductor stack and the first electrode.

4. The light-emitting device according to claim 1, wherein the first light-emitting semiconductor stack has a first transverse width and the second light-emitting semiconductor stack has a second transverse width larger than the first transverse width.

5. The light-emitting device according to claim 1, wherein the first extension part comprises an inner extension electrode and an outer extension electrode surrounding the inner extension electrode.

6. The light-emitting device according to claim 1, wherein the first wavelength is between 620 nm and 790 nm, and the second wavelength is between 790 nm and 1500 nm.

7. The light-emitting device according to claim 1, wherein each of the first active layer and the second active layer comprises a multi-quantum well.

8. The light-emitting device according to claim 1, wherein the second wavelength is longer than the first wavelength.

9. A light-emitting module comprising:

a submount; and a light-emitting device of claim 1 disposed on the submount.

10. The light-emitting device according to claim 1, further comprising a second electrode on the substrate, wherein the second electrode is electrically connected to the first light-emitting semiconductor stack and the second light-emitting semiconductor stack.

11. The light-emitting device according to claim 10, further comprising a second contact layer between the second light-emitting semiconductor stack and the second electrode.

12. The light-emitting device according to claim 11, further comprising a bonding layer connecting the second contact layer to the substrate.

13. The light-emitting device according to claim 12, wherein the bonding layer comprises a metal material.

14. The light-emitting device according to claim 1, further comprising a third electrode electrically connected to the second light-emitting semiconductor stack, wherein the third electrode has a second pad and a second extension part extended from the second pad.

15. The light-emitting device according to claim 14, wherein the light-emitting device has an upper surface with an edge, and the second extension part is closer to the edge than the first extension part from a top view.

16. The light-emitting device according to claim 14, wherein the first extension part comprises a plurality of first extension electrodes.

17. The light-emitting device according to claim 16, wherein the light-emitting device has an upper surface with an edge from a top view and each of the first extension electrodes is parallel or perpendicular to the edge from the top view.

18. The light-emitting device according to claim 14, wherein the second extension part comprises a plurality of second extension electrodes.

19. The light-emitting device according to claim 18, wherein the light-emitting device has an upper surface with an edge from a top view, and each of the second extension electrodes is parallel or perpendicular to the edge from the top view.

* * * * *